(12) United States Patent
Chauhan et al.

(10) Patent No.: US 12,181,905 B2
(45) Date of Patent: *Dec. 31, 2024

(54) LOW NOISE HIGH PRECISION VOLTAGE REFERENCE

(71) Applicant: TEXAS INSTRUMENTS INCORPORATED, Dallas, TX (US)

(72) Inventors: Rajat Chauhan, Bangalore (IN); Divya Kaur, Delhi (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 223 days.

This patent is subject to a terminal disclaimer.

(21) Appl. No.: 17/682,811

(22) Filed: Feb. 28, 2022

(65) Prior Publication Data

US 2022/0390976 A1 Dec. 8, 2022

(30) Foreign Application Priority Data

Jun. 7, 2021 (IN) .............................. 202141025164

(51) Int. Cl.
*G05F 3/26* (2006.01)
*G01R 35/00* (2006.01)

(52) U.S. Cl.
CPC ........... *G05F 3/262* (2013.01); *G01R 35/007* (2013.01)

(58) Field of Classification Search
CPC ... G05F 3/262; G05F 3/02; G05F 3/30; G05F 3/22; G05F 3/222; G05F 3/242; G05F 3/225; G05F 3/245; G05F 3/20; G05F 3/00; G05F 3/08; G05F 3/10; G05F 3/16; G05F 3/18; G05F 3/185; G05F 3/227; G05F 3/247; G05F 3/26; G05F 3/265; G05F 3/24; G05R 35/007
See application file for complete search history.

(56) References Cited

FOREIGN PATENT DOCUMENTS

WO WO-2006098533 A1 * 9/2006 .......... H03M 1/0619
WO WO-2016190112 A1 * 12/2016 ................ G05F 1/56

OTHER PUBLICATIONS

B.J. Skromme, Teaching Series and Parallel Connections, 3, Aug. 2022, vol. 65, p. 462, 463 (Year: 2022).*

* cited by examiner

*Primary Examiner* — Bryan R Perez
(74) *Attorney, Agent, or Firm* — Charles F. Koch; Frank D. Cimino

(57) ABSTRACT

In described examples, a circuit includes a current mirror circuit. A first stage is coupled to the current mirror circuit. A second stage is coupled to the current mirror circuit and to the first stage. A voltage divider network is coupled to the second stage. The circuit includes an output transistor having first and second terminals, in which the first terminal of the output transistor is coupled to the first stage, and the second terminal of the output transistor is coupled to the voltage divider network.

21 Claims, 7 Drawing Sheets

LOW NOISE HIGH PRECISION VOLTAGE REFERENCE

CROSS-REFERENCE TO RELATED APPLICATION

This application claims priority to India Provisional Patent Application No. 202141025164 filed Jun. 7, 2021, which is hereby incorporated by reference in its entirety.

TECHNICAL FIELD

This description relates generally to voltage reference circuits, and more particularly to a high precision voltage reference circuit with low noise.

BACKGROUND

A voltage reference circuit is useful in various integrated circuits, electronic devices and electronic systems requiring a stable voltage reference over a range of temperature and process variations. These voltage reference circuits are useful in many applications, including environment sensing applications and medical applications, where relatively small or weak signals need to be measured, which requires higher resolution analog to digital converters (ADCs) that operate from an accurate and stable voltage source. Also, many of these applications are implemented as battery powered, portable, or remote devices, so power consumption is a concern. Accordingly, relatively low quiescent current is often specified as a requirement for a given voltage reference circuit.

SUMMARY

In described examples, a circuit includes a current mirror circuit. A first stage is coupled to the current mirror circuit. A second stage is coupled to the current mirror circuit and to the first stage. A voltage divider network is coupled to the second stage. The circuit includes an output transistor having first and second terminals, in which the first terminal of the output transistor is coupled to the first stage, and the second terminal of the output transistor is coupled to the voltage divider network.

DETAILED DESCRIPTION OF EXAMPLE EMBODIMENTS

Figure 1:
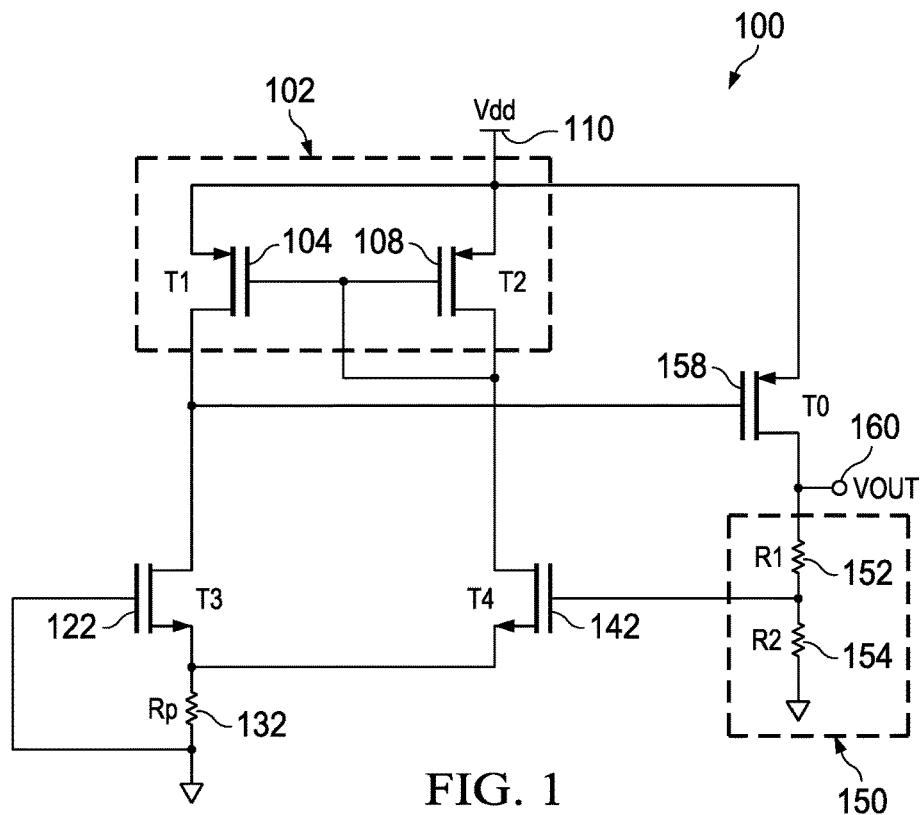
FIG. 1 is a schematic of a circuit.

FIG. 1 is a schematic of a circuit 100. The circuit 100 includes a current mirror circuit 102, a third transistor T3 122, a fourth transistor T4 142, a voltage divider network 150 and an output transistor T0 158. The current mirror circuit 102 is coupled to a power supply Vdd 110. The current mirror circuit 102 includes a first transistor T1 104 and a second transistor T2 108. A source terminal of the first transistor T1 104 is coupled to the power supply Vdd 110, and a drain terminal of the first transistor T1 104 is coupled to the third transistor T3 122. A gate terminal of the first transistor T1 104 is coupled to a gate terminal of the second transistor T2 108.

A source terminal of the second transistor T2 108 is coupled to the power supply Vdd 110, and a drain terminal of the second transistor T2 108 is coupled to the fourth transistor T4 142. A gate terminal of the second transistor T2 108 is coupled to the gate terminal of the first transistor T1 104 and to the drain terminal of the second transistor T2 108. For the third transistor T3 122, its drain terminal is coupled to the first transistor T1 104 in the current mirror circuit 102, and its source terminal is coupled to a first end of a primary resistor Rp 132. A gate terminal of the third transistor T3 122 is coupled to a second end of the primary resistor Rp 132 and to a ground terminal.

A drain terminal of the fourth transistor T4 142 is coupled to the second transistor T2 108 in the current mirror circuit 102, and a source terminal of the fourth transistor T4 142 is coupled to the source terminal of the third transistor T3 122 and to the first end of the primary resistor Rp 132. A gate terminal of the fourth transistor T4 142 is coupled to the voltage divider network 150.

A source terminal of the output transistor T0 158 is coupled to the power supply Vdd 110, and a drain terminal of the output transistor T0 158 is coupled to the voltage divider network 150. A gate terminal of the output transistor T0 158 is coupled to the drain terminals of the first transistor T1 104 and the third transistor T3 122. The voltage divider network includes a first resistor R1 152 and a second resistor R2 154. A first end of the first resistor R1 152 is coupled to the drain terminal of the output transistor T0 158, and a second end of the first resistor R1 152 is coupled to the second resistor R2 154 and to the fourth transistor T4 142. A first end of the second resistor R2 154 is coupled to the first resistor R1 152 and to the fourth transistor T4 142. A second end of the second resistor R2 154 is coupled to a ground terminal.

In operation, the configuration of the current mirror circuit 102 results in a current at the drain terminal of the first transistor T1 104 being mirrored at the drain terminal of the second transistor T2 108. Accordingly, the current at the drain terminal of the first transistor T1 104 is substantially the same as the current at the drain terminal of the second transistor T2 108. The first transistor T1 104 and the second transistor T2 108 are p-channel field effect transistors (PFETs). The third transistor T3 122 is a natural n-channel field effect transistor (NFET) and has a negative threshold voltage. The fourth transistor T4 142 is a standard NFET having a positive threshold voltage. The third transistor T3 122 and the fourth transistor T4 142 have different threshold voltages, and both of these transistors form a voltage generation circuit.

The first transistor T1 104, the second transistor T2 108, the third transistor T3 122 and the fourth transistor T4 142 form a differential amplifier stage. The output transistor T0

158 and the voltage divider network 150 form a scaling amplifier stage. The first transistor T1 104 and the second transistor T2 108 function as load transistors, while the third transistor T3 122 and the fourth transistor T4 142 function as input transistors, for the differential amplifier stage. At an output of this differential amplifier stage, a control signal is provided to the gate terminal of the output transistor T0 158. An output voltage Vout 160 is generated at the drain terminal of the output transistor T0 158. The output voltage Vout 160 is provided as a feedback to the differential amplifier stage at the gate terminal of the fourth transistor T4 142.

The output voltage Vout 160 is a sum of a source-to-gate voltage (VsgNAT) across the third transistor T3 122, a gate-to-source voltage (VgsSVT) across the fourth transistor T4 142, and a voltage (Vscale) across the first resistor R1 152. The output voltage Vout 160 is expressed as:

$$V_{out} = V_{sgNAT} + V_{gsSVT} + V_{scale} \quad (1)$$

A difference between the gate-to-source voltage across the third transistor T3 122 and the gate-to-source voltage across the fourth transistor T4 142 is defined as a voltage threshold gap (VTgap), and can be expressed as sum of VsgNAT and VgsSVT. Accordingly, equation (1) can be expressed as:

$$V_{out} = VT_{gap} + V_{scale} \quad (2)$$

Also, the voltage (Vscale) across the first resistor R1 152 is expressed as $$V_{scale} = VT_{gap} * \left(\frac{R1}{R2}\right) \quad (3)$$

Using equations (2) and (3), the output voltage Vout 160 can be expressed as:

$$V_{out} = VT_{gap} * \left(1 + \frac{R1}{R2}\right) \quad (4)$$

VTgap is a difference in threshold voltages of the third transistor T3 122 and the fourth transistor T4 142, and is generally in a range of 0.6V to 0.9V. To achieve higher levels of output voltage Vout 160, VTgap needs to be scaled up. When the first resistor R1 152 and the second resistor R2 154 are increased to scale-up the VTgap, it increases thermal noise in the output voltage Vout 160 generated by the circuit 100. Also, scaling up VTgap by a factor also scales up noise generated by a differential amplifier stage (combination of the third transistor T3 122 and the fourth transistor T4 142) by the same factor.

Thus, the circuit 100 is difficult to use as a voltage reference circuit in applications where small sensed signals require very high resolution, because such circuits require precise output voltage Vout 160 with very low noise. Also, an increase in quiescent current of the circuit 100 can reduce the noise in the circuit 100. But in that case, the circuit 100 is not useful in portable or battery powered applications, because such circuits have more stringent quiescent current requirement along with requirements of low noise.

Figure 2:
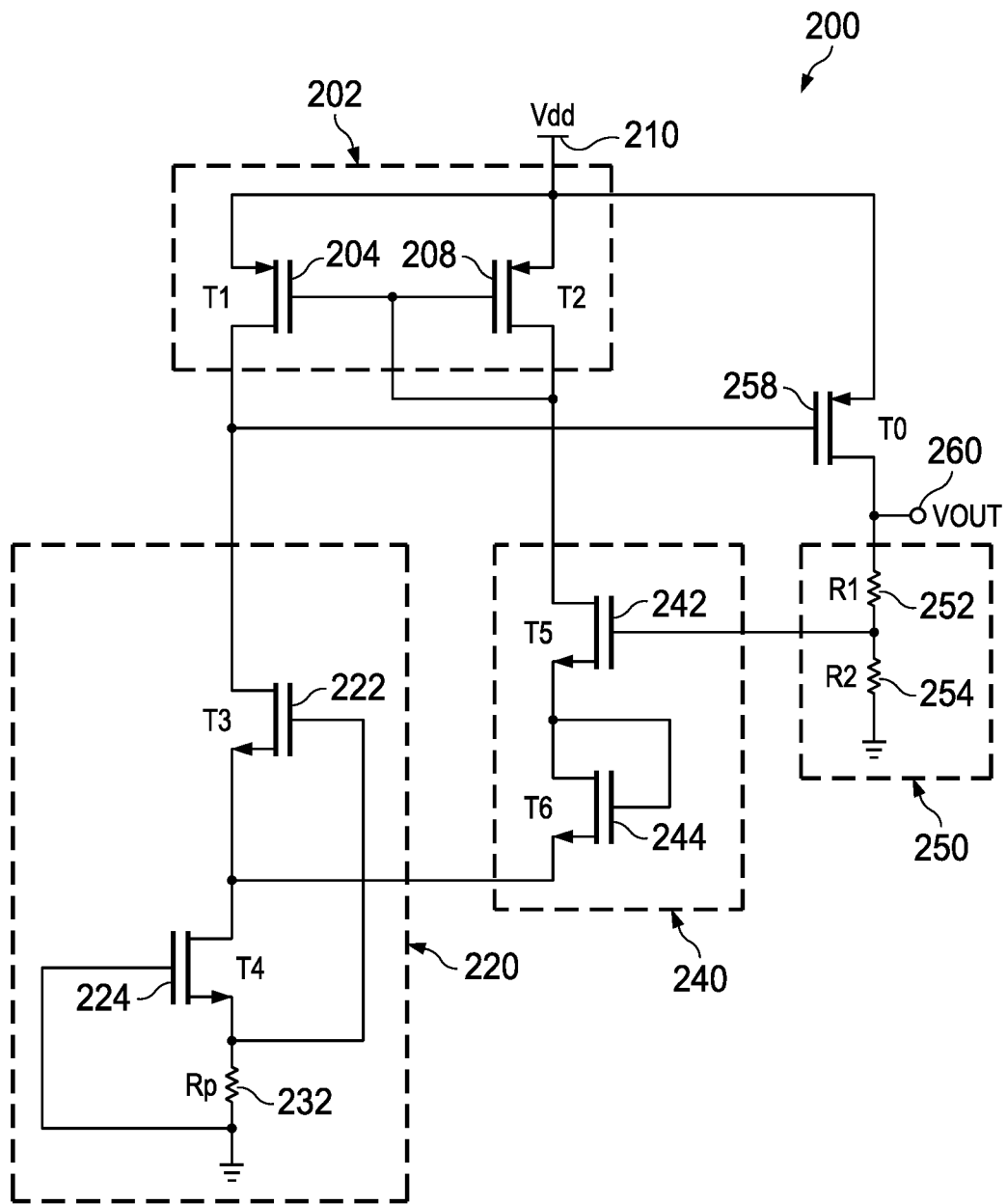
FIG. 2 is a schematic of a circuit, according to an embodiment.

FIG. 2 is a schematic of a circuit 200, according to an embodiment. The circuit 200 includes a current mirror circuit 202, a first stage 220, a second stage 240, a voltage divider network 250 and an output transistor T0 258. The current mirror circuit 202 is coupled to a power supply Vdd 210. The first stage 220 and the second stage 240 are coupled to the current mirror circuit 202. The first stage 220 is also coupled to the second stage 240. The first stage 220 includes a first set of transistors. The first set of transistors include a third transistor T3 222 and a fourth transistor T4 224. The second stage 240 includes a second set of transistors. The second set of transistors includes a fifth transistor T5 242 and a sixth transistor T6 244. The current mirror circuit 202 includes a first transistor T1 204 and a second transistor T2 208. A source terminal of the first transistor T1 204 is coupled to the power supply Vdd 210, and a drain terminal of the first transistor T1 204 is coupled to the third transistor T3 222. A gate terminal of the first transistor T1 204 is coupled to a gate terminal of the second transistor T2 208.

A source terminal of the second transistor T2 208 is coupled to the power supply Vdd 210, and a drain terminal of the second transistor T2 208 is coupled to the fifth transistor T5 242. A gate terminal of the second transistor T2 208 is coupled to the gate terminal of the first transistor T1 204 and to the drain terminal of the second transistor T2 208. For the third transistor T3 222, its drain terminal is coupled to the first transistor T1 204 in the current mirror circuit 202, and its gate terminal is coupled to a first end of a primary resistor Rp 232. A source terminal of the third transistor T3 222 is coupled to the second stage 240 and to a drain terminal of the fourth transistor T4 224.

A drain terminal of the fourth transistor T4 224 is coupled to the second stage 240 and to the source terminal of the third transistor T3 222. A source terminal of the fourth transistor T4 224 is coupled to the first end of the primary resistor Rp 232, and a gate terminal of the fourth transistor T4 224 is coupled to a second end of the primary resistor Rp 232. Thus, the primary resistor Rp 232 is coupled between the gate terminals of the third transistor T3 222 and the fourth transistor T4 224. The second end of the primary resistor Rp 232 is coupled to a ground terminal. In one example, a source terminal of a transistor in the circuit 200 is a first terminal, a drain terminal is a second terminal, and a gate terminal is a third terminal.

A drain terminal of the fifth transistor T5 242 is coupled to the second transistor T2 208 in the current mirror circuit 202, and a gate terminal of the fifth transistor T5 242 is coupled to the voltage divider network 250. A source terminal of the fifth transistor T5 242 is coupled to a drain terminal of the sixth transistor T6 244. A source terminal of the sixth transistor T6 244 is coupled to the source terminal of the third transistor T3 222 and to the drain terminal of the fourth transistor T4 224. A gate terminal of the sixth transistor T6 244 is coupled to the source terminal of the fifth transistor T5 242 and to the drain terminal of the sixth transistor T6 244.

The output transistor T0 258 is coupled to the first stage 220, the current mirror circuit 202 and the voltage divider network 250. A gate terminal of the output transistor T0 258 is coupled to the drain terminal of the third transistor T3 222 in the first stage 220 and to the drain terminal of the first transistor T1 204 in the current mirror circuit 202. A source terminal of the output transistor T0 258 is coupled to the power supply Vdd 210. A drain terminal of the output transistor T0 258 is coupled to the voltage divider network 250.

The voltage divider network 250 includes a first resistor R1 252 and a second resistor R2 254. A first end of the first resistor R1 252 is coupled to the drain terminal of the output transistor T0 258, and a second end of the first resistor R1 252 is coupled to the second resistor R2 254 and to the fifth transistor T5 242. A first end of the second resistor R2 254 is coupled to the first resistor R1 252 and to the fifth transistor T5 242. A second end of the second resistor R2 254 is coupled to a ground terminal.

The circuit 200 may include one or more conventional components that are not described herein for brevity. Each component of the circuit 200 may also be coupled to other components or blocks in FIG. 2, but those connections are not described herein for brevity. Also, each block or component of FIG. 2 may be coupled to conventional components of a system using the circuit 200, which are also not shown in FIG. 2 for brevity.

In operation, the configuration of the current mirror circuit 202 results in a current at the drain terminal of the first transistor T1 204 being mirrored at the drain terminal of the second transistor T2 208. Accordingly, the current at the drain terminal of the first transistor T1 204 is substantially the same as the current at the drain terminal of the second transistor T2 208. The first transistor T1 204, the second transistor T2 208 and the output transistor T0 258, in one example, are PFETs. The third transistor T3 222, the fourth transistor T4 224, the fifth transistor T5 242 and the sixth transistor T6 244, in another example, are NFETs.

In one version, the third transistor T3 222 and the fourth transistor T4 224 are natural voltage threshold transistors (NVTs), having a negative voltage threshold. The negative voltage threshold, in one example, is within +/−10% of −200 mV. In yet another version, the fifth transistor T5 242 and the sixth transistor T6 244 are standard voltage threshold transistors with a positive voltage threshold. The positive voltage threshold, in one example, is within +/−10% of +600 millivolts (mV).

The third transistor T3 222, the fourth transistor T4 224, the fifth transistor T5 242 and the sixth transistor T6 244 form a voltage generation circuit. The first transistor T1 204, the second transistor T2 208, the third transistor T3 222, the fourth transistor T4 224, the fifth transistor T5 242 and the sixth transistor T6 244 form a differential amplifier stage. The output transistor T0 258 and the voltage divider network 250 form a scaling amplifier stage. The first transistor T1 204 and the second transistor T2 208 function as load transistors, while the third transistor T3 222, the fourth transistor T4 224, the fifth transistor T5 242 and the sixth transistor T6 244 function as input transistors, for the differential amplifier stage. At an output of this differential amplifier stage, a control signal is provided to the gate terminal of the output transistor T0 258. An output voltage Vout 260 is generated at the drain terminal of the output transistor T0 258. The output voltage Vout 260 is provided as a feedback to the differential amplifier stage at the gate terminal of the fifth transistor T5 242.

The output voltage Vout 260 is a sum of a source-to-gate voltage (VsgNAT1) across the fourth transistor T4 224, a source-to-gate voltage (VsgNAT2) across the third transistor T3 222, a gate-to-source voltage (VgsSVT1) across the fifth transistor T5 242, a gate-to-source voltage (VgsSVT2) across the sixth transistor T6 244, and a voltage (Vscale) across the first resistor R1 252. The output voltage Vout 260 is expressed as:

$$V_{out}=V_{sgNAT1}+V_{sgNAT2}+V_{gsSVT1}+V_{gsSVT2}+V_{scale} \quad (5)$$

The source-to-gate voltage (VsgNAT1) across the fourth transistor T4 224 is equal to the source-to-gate voltage (VsgNAT2) across the third transistor T3 222. Also, the gate-to-source voltage (VgsSVT1) across the fifth transistor T5 242 is equal to the gate-to-source voltage (VgsSVT2) across the sixth transistor T6 244. Thus, equation (5) can be expressed as:

$$V_{out}=2V_{sgNAT}+2V_{gsSVT}+V_{scale} \quad (6)$$

A voltage (2VsgNAT) generated by the first stage 220 is a first reference voltage, and a voltage (2VgsSVT) generated by the second stage 240 is a second reference voltage. The voltage (Vscale) generated by the voltage divider network 250 is a third reference voltage. In one version, the second reference voltage is greater than the first reference voltage. In another version, a sum of thresholds of transistors in the second stage 240 is greater than a sum of thresholds of transistors in the first stage 220. As shown in equation (6), the output voltage Vout 260 is a function of the first reference voltage (2VsgNAT), the second reference voltage (2VgsSVT) and the third reference voltage (Vscale). A difference between the gate-to-source voltage across the fourth transistor T4 224 and the gate-to-source voltage across the sixth transistor T6 244 is defined as a voltage threshold gap (VTgap), and can be expressed as sum of VsgNAT and VgsSVT. Accordingly, equation (6) can be expressed as:

$$V_{out}=2VT_{gap}+V_{scale} \quad (7)$$

Also, the voltage (Vscale) across the first resistor R1 252 is expressed as $$V_{scale} = 2VT_{gap} * \left(\frac{R1}{R2}\right) \quad (8)$$

Using equations (7) and (8), the output voltage Vout 260 can be expressed as:

$$V_{out} = 2VT_{gap} * \left(1 + \frac{R1}{R2}\right) \quad (9)$$

VTgap is a difference in threshold voltages of the fourth transistor T4 224 and the sixth transistor T6 244, and is generally in a range of 0.6V to 0.9V. Thus, the circuit 200 achieves higher level of output voltage Vout 260 without increasing noise in the output voltage Vout 260. The scaling of the first resistor R1 252 and the second resistor R2 254 is not required for higher output voltage Vout 260, which otherwise results in high thermal noise. For the same output voltage Vout, the first resistor R1 252 and the second resistor R2 254 in circuit 200 are smaller than the first resistor R1 152 and the second resistor R2 154 in circuit 100. Also, because scaling of VTgap is not required in the circuit 200, scaling of noise generated by combination of the first stage 220 and the second stage 240 is much lower as compared to the circuit 100.

The stacking of the third transistor T3 222, the fourth transistor T4 224, the fifth transistor T5 242 and the sixth transistor T6 244 forms the circuit 200 to generate higher output voltage Vout 260 without increasing the noise. This makes the circuit 200 useful as a voltage reference circuit. The circuit 200 is useful as a voltage reference circuit in applications where small sensed signals require very high resolution, because such circuits require precise output voltage Vout 260 with low noise. Also, the circuit 200 achieves lower noise without increase in quiescent current and accordingly is useful in portable or battery powered applications, because such circuits have more stringent quiescent current requirement along with requirements of low noise.

The circuit 200 is useful as a voltage reference circuit in applications that require higher accuracy over a broad range of temperatures. Applications like environmental sensors and medical applications can use circuit 200 as a voltage reference, because it provides low temperature drift and accordingly increases accuracy of such systems. The ultra-low power consumption of circuit 200 makes it useful in battery powered applications. The low noise feature of circuit 200 makes it useful in precision signal chain applications. The circuit 200 is useful in multiple systems, such as field transmitters, fault indicators, infusion pumps, optical modules and ADAS (advanced driver assistance systems).

Figure 3:
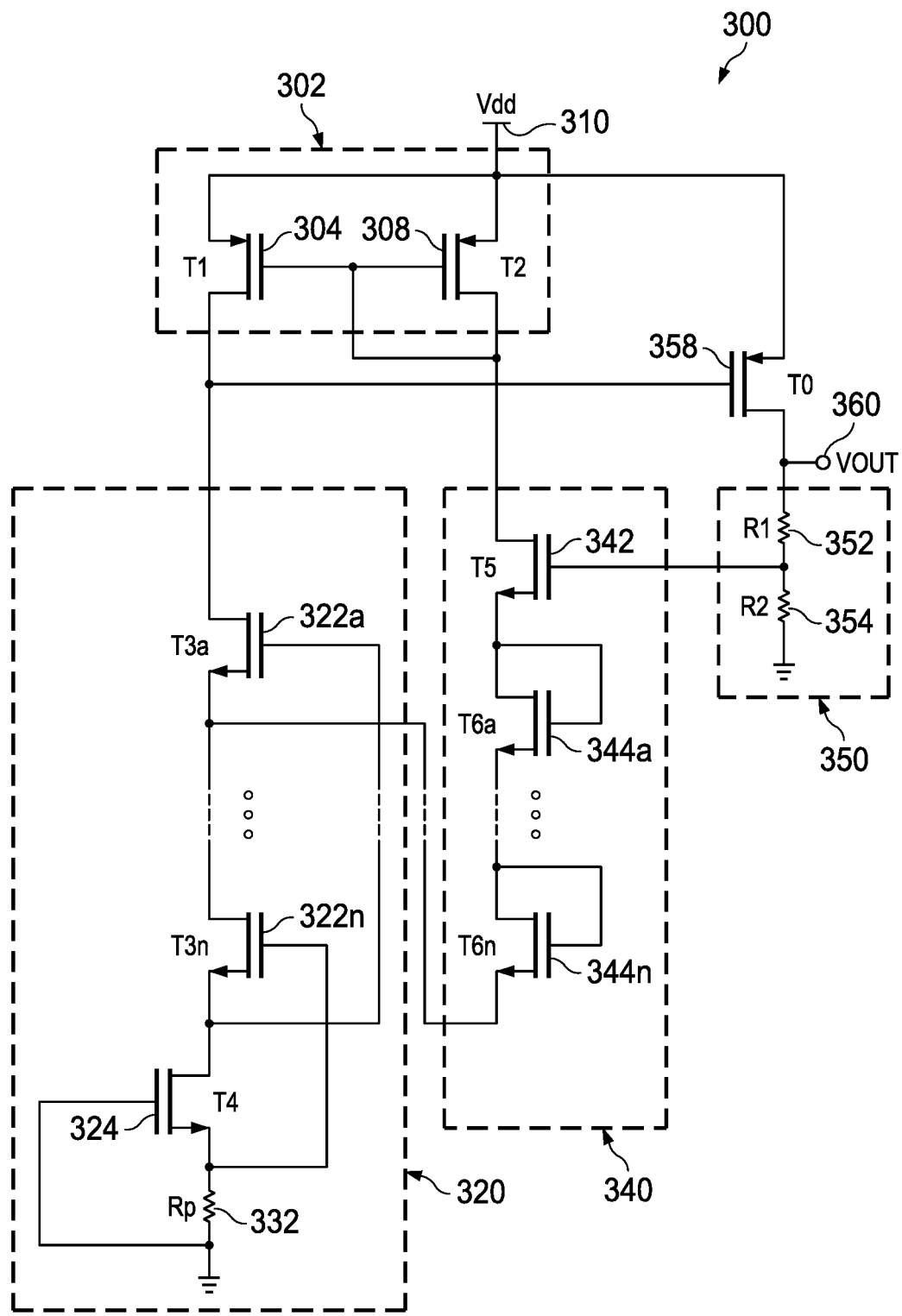
FIG. 3 is a schematic of a circuit, according to an embodiment.

FIG. 3 is a schematic of a circuit 300, according to an embodiment. The circuit 300 includes a current mirror circuit 302, a first stage 320, a second stage 340, a voltage divider network 350 and an output transistor T0 358. The current mirror circuit 302 is coupled to a power supply Vdd 310. The first stage 320 and the second stage 340 are coupled to the current mirror circuit 302. The first stage 320 is also coupled to the second stage 340. The first stage 320 includes a set of tertiary transistors shown as T3a 322a, T3b 322b to T3n 322n (where n is an integer greater than one) and a fourth transistor T4 324. The second stage 340 includes a fifth transistor T5 342 and a set of senary transistors shown as T6a 344a, T6b 344b to T6n 344n (where n is an integer greater than one). The current mirror circuit 302 includes a first transistor T1 304 and a second transistor T2 308. A source terminal of the first transistor T1 304 is coupled to the power supply Vdd 310, and a drain terminal of the first transistor T1 304 is coupled to the tertiary transistor T3a 322a. A gate terminal of the first transistor T1 304 is coupled to a gate terminal of the second transistor T2 308.

A source terminal of the second transistor T2 308 is coupled to the power supply Vdd 310, and a drain terminal of the second transistor T2 308 is coupled to the fifth transistor T5 342. A gate terminal of the second transistor T2 308 is coupled to the gate terminal of the first transistor T1 304 and to the drain terminal of the second transistor T2 308. For the tertiary transistor T3a 322a, its drain terminal is coupled to the first transistor T1 304 in the current mirror circuit 302, and its gate terminal is coupled to a drain terminal of the tertiary transistor T3b 302b. A source terminal of the tertiary transistor T3a 322a is coupled to the second stage 340 and to a source terminal of the tertiary transistor T3a 322a.

For the tertiary transistor T3n 322n, its drain terminal is coupled to the tertiary transistor T3(n-1)n 322(n-1), and its gate terminal is coupled to a first end of a primary resistor Rp 332. A source terminal of the tertiary transistor T3n 322n is coupled to a drain terminal of the fourth transistor T4 324. A source terminal of the fourth transistor T4 324 is coupled to the first end of the primary resistor Rp 332, and a gate terminal of the fourth transistor T4 324 is coupled to a second end of the primary resistor Rp 332. Thus, the primary resistor Rp 332 is coupled between the gate terminals of the tertiary transistor T3n 322n and the fourth transistor T4 324. The second end of the primary resistor Rp 332 is coupled to a ground terminal. In one example, a source terminal of a transistor in the circuit 300 is a first terminal, a drain terminal is a second terminal, and a gate terminal is a third terminal.

A drain terminal of the fifth transistor T5 342 is coupled to the second transistor T2 308 in the current mirror circuit 302, and a gate terminal of the fifth transistor T5 342 is coupled to the voltage divider network 350. A source terminal of the fifth transistor T5 342 is coupled to a drain terminal of the senary transistor T6a 344a. A source terminal of the senary transistor T6a is coupled to the drain terminal of the senary transistor T6b 344b. A gate terminal of the senary transistor T6a 344a is coupled to the source terminal of the fifth transistor T5 342 and to the drain terminal of the senary transistor T6a 344a.

A source terminal of the senary transistor T6n 344n is coupled to the source terminal of the tertiary transistor T3a 322a. A gate terminal of the senary transistor T6n 344n is coupled to the source terminal of the senary transistor T6(n-1) 344(n-1) and to the drain terminal of the senary transistor T6n 344n.

The output transistor T0 358 is coupled to the first stage 330, the current mirror circuit 302 and the voltage divider network 350. A gate terminal of the output transistor T0 358 is coupled to the drain terminal of the tertiary transistor T3a 322a in the first stage 320 and to the drain terminal of the first transistor T1 304 in the current mirror circuit 302. A source terminal of the output transistor T0 358 is coupled to the power supply Vdd 310. A drain terminal of the output transistor T0 358 is coupled to the voltage divider network 350.

The voltage divider network includes a first resistor R1 352 and a second resistor R2 354. A first end of the first resistor R1 352 is coupled to the drain terminal of the output transistor T0 358 and a second end of the first resistor R1 352 is coupled to the second resistor R2 354 and to the fifth transistor T5 342. A first end of the second resistor R2 354 is coupled to the first resistor R1 352 and to the fifth transistor T5 342. A second end of the second resistor R2 354 is coupled to a ground terminal.

The circuit 300 may include one or more conventional components that are not described herein for brevity. Each component of the circuit 300 may also be coupled to other components or blocks in FIG. 3, but those connections are not described herein for brevity. Also, each block or component of FIG. 3 may be coupled to conventional components of a system using the circuit 300, which are also not shown in FIG. 3 for brevity.

In operation, the configuration of the current mirror circuit 302 results in a current at the drain terminal of the first transistor T1 304 being mirrored at the drain terminal of the second transistor T2 308. Accordingly, the current at the drain terminal of the first transistor T1 304 is substantially the same as the current at the drain terminal of the second transistor T2 308. The first transistor T1 304, the second transistor T2 308 and the output transistor T0 358, in one example, are PFETs. The set of tertiary transistors T3a 322a to T3n 322n, the fourth transistor T4 334, the fifth transistor T5 342 and the set of senary transistors T6a 344a to T6n 344n, in another example, are NFETs.

In one version, the set of tertiary transistors T3a 322a to T3n 322n and the fourth transistor T4 334 are natural voltage threshold transistors (NVTs), having a negative voltage threshold. The negative voltage threshold, in one example, is within +/-10% of -300 mV. In yet another version, the fifth transistor T5 342 and the set of senary transistors T6a 344a to T6n 344n are standard voltage threshold transistors with a positive voltage threshold. The positive voltage threshold, in one example, is within +/-10% of +600 millivolts (mV).

The set of tertiary transistors T3a 322a to T3n 322n, the fourth transistor T4 324, the fifth transistor T5 342 and the set of senary transistors T6a 344a to T6n 344n form a voltage generation circuit. The first transistor T1 304, the second transistor T2 308, the set of tertiary transistors T3a 322a to T3n 322n, the fourth transistor T4 334, the fifth transistor T5 342 and the set of senary transistors T6a 344a to T6n 344n form a differential amplifier stage. The output transistor T0 358 and the voltage divider network 350 form a scaling amplifier stage. The first transistor T1 304 and the second transistor T2 308 function as load transistors, while the set of tertiary transistors T3a 322a to T3n 322n, the fourth transistor T4 334, the fifth transistor T5 342 and the set of sernary transistors T6a 344a to T6n 344n function as input transistors, for the differential amplifier stage. At output of this differential amplifier stage, a control signal is provided to the gate terminal of the output transistor T0 358. An output voltage Vout 360 is generated at the drain terminal of the output transistor T0 358. The output voltage Vout 360 is provided as a feedback to the differential amplifier stage at the gate terminal of the fifth transistor T5 342.

The output voltage Vout 360 is a sum of a source-to-gate voltage (VsgNAT1) across the fourth transistor T4 334, a source-to-gate voltage (VsgNAT2) across each of the n tertiary transistors, a gate-to-source voltage (VgsSVT1) across the fifth transistor T5 342, a gate-to-source voltage (VgsSVT2) across each of the n sernary transistors, and a voltage (Vscale) across the first resistor R1 352. The output voltage Vout 360 is expressed as:

$$V_{out}=V_{sgNAT1}+n*V_{sgNAT2}+V_{gsSVT1}+n*V_{gsSVT2}+V_{scale} \quad (10)$$

The source-to-gate voltage (VsgNAT1) across the fourth transistor T4 334 is equal to the source-to-gate voltage (VsgNAT2) across each of the tertiary transistors. Also, the gate-to-source voltage (VgsSVT1) at the gate terminal of the fifth transistor T5 342 is equal to the gate-to-source voltage (VgsSVT2) across each of the sernary transistors. Thus, equation (10) can be expressed as:

$$V_{out}=(n+1)V_{sgNAT}+(n+1)V_{gsSVT}+V_{scale} \quad (11)$$

A voltage ((n+1)VsgNAT) generated by the first stage 320 is a first reference voltage, and a voltage ((n+1)VgsSVT) generated by the second stage 340 is a second reference voltage. The voltage (Vscale) generated by the voltage divider network 350 is a third reference voltage. In one version, the second reference voltage is greater than the first reference voltage. In another version, a sum of thresholds of transistors in the second stage 340 is greater than a sum of thresholds of transistors in the first stage 320. As shown in equation (11), the output voltage Vout 360 is a function of the first reference voltage ((n+1)VsgNAT), the second reference voltage ((n+1)VgsSVT) and the third reference voltage (Vscale).

A difference between the gate-to-source voltage across the fourth transistor T4 334 and the gate-to-source voltage across the sernary transistor T6n 344n is defined as a voltage threshold gap (VTgap), and can be expressed as sum of VsgNAT and VgsSVT. Accordingly, equation (11) can be expressed as:

$$V_{out}=(n+1)VT_{gap}+V_{scale} \quad (12)$$

Also, the voltage (Vscale) across the first resistor R1 352 is expressed as $$V_{scale} = (n + 1)VT_{gap} * \left(\frac{R1}{R2}\right) \quad (13)$$

Using equations (12) and (13), the output voltage Vout 360 can be expressed as:

$$V_{out} = (n + 1)VT_{gap} * \left(1 + \frac{R1}{R2}\right) \quad (14)$$

As VTgap is a difference in threshold voltages of the fourth transistor T4 334 and the sernary transistor T6n 344n, and is generally in a range of 0.6V to 0.9V. Thus, the circuit 300 achieves higher level of output voltage Vout 360 without increasing noise in the output voltage Vout 360. The scaling of the first resistor R1 352 and the second resistor R2 354 is not required for higher output voltage Vout 360, which otherwise results in high thermal noise. For the same output voltage Vout, the first resistor R1 352 and the second resistor R2 354 in circuit 300 are smaller than the first resistor R1 152 and the second resistor R2 154 in circuit 100. Also, because scaling of VTgap is not required in the circuit 300, scaling of noise generated by combination of the first stage 320 and the second stage 340 is much lower as compared to the circuit 100.

The first stage 320 and the second stage 340 form the circuit 300 to generate higher output voltage Vout 360 without increasing the noise. This makes the circuit 300 useful as a voltage reference circuit. The circuit 300 is useful as a voltage reference circuit in applications where small sensed signals require very high resolution, because such circuits require precise output voltage Vout 360 with low noise. Also, the circuit 300 achieves lower noise without increase in quiescent current and accordingly is useful in portable or battery powered applications, because such circuits have more stringent quiescent current requirement along with requirements of low noise.

Figure 4:
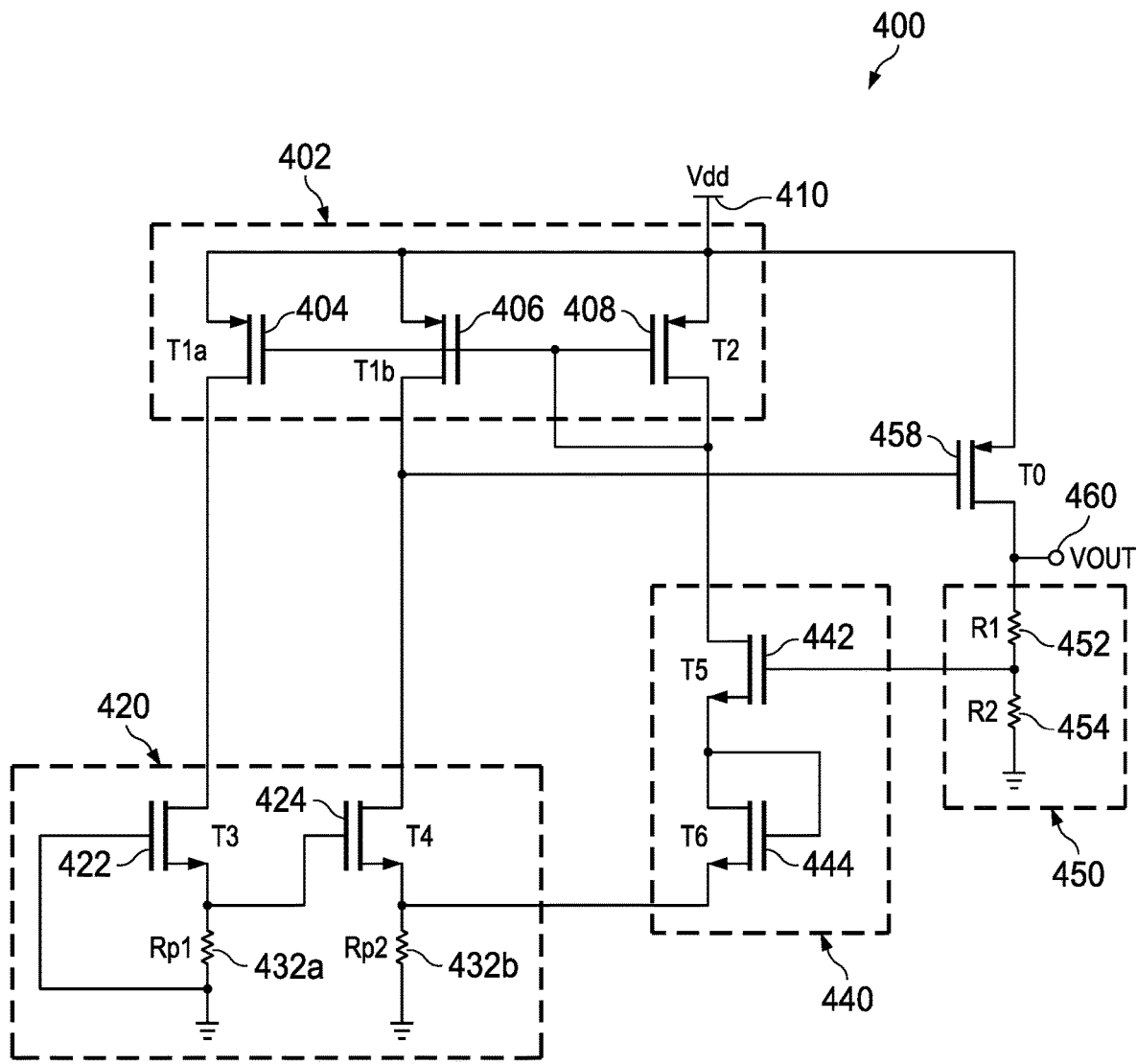
FIG. 4 is a schematic of a circuit, according to an embodiment.

FIG. 4 is a schematic of a circuit 400, according to an embodiment. The circuit 400 includes a current mirror circuit 402, a first stage 420, a second stage 440, a voltage divider network 450 and an output transistor T0 458. The current mirror circuit 402 is coupled to a power supply Vdd 410. The first stage 420 and the second stage 440 are coupled to the current mirror circuit 402. The first stage 420 is also coupled to the second stage 440. The first stage 420 includes a third transistor T3 422 and a fourth transistor T4 424. The second stage 440 includes a fifth transistor T5 442 and a sixth transistor T6 444. The current mirror circuit 402 includes a set of first transistors (T1a 404 and T1b 406) and a second transistor T2 408. A source terminal of the transistor T1a 404 is coupled to the power supply Vdd 410, and a drain terminal of the transistor T1a 404 is coupled to the third transistor T3 422. A gate terminal of the transistor T1a 404 is coupled to a gate terminal of the second transistor T2 408.

A source terminal of the transistor T1b 406 is coupled to the power supply Vdd 410, and a drain terminal of the transistor T1b 406 is coupled to the fourth transistor T4 424. A gate terminal of the transistor T1b 406 is coupled to a gate terminal of the second transistor T2 408. A source terminal of the second transistor T2 408 is coupled to the power supply Vdd 410, and a drain terminal of the second transistor T2 408 is coupled to the fifth transistor T5 442. A gate terminal of the second transistor T2 408 is coupled to the gate terminals of the first set of transistors T1a 404 and 406. The gate terminal of the second transistor T2 408 is also coupled to the drain terminal of the second transistor T2 408. For the third transistor T3 422, its source terminal is coupled to a gate terminal of the fourth transistor T4 424 and to a first end of a first primary resistor Rp1 432a. A drain terminal of the third transistor T3 422 is coupled to the transistor T1a 404 in the current mirror circuit 402, and its gate terminal is coupled to a second end of the first primary resistor Rp1 432a.

A drain terminal of the fourth transistor T4 424 is coupled to the second stage 440 and to a first end of a second primary resistor Rp2 432b. A source terminal of the fourth transistor T4 424 is coupled a drain terminal of the transistor T1b 406 in the current mirror circuit 402. The gate terminal of the fourth transistor T4 424 is coupled to the source terminal of the third transistor T3 422. The second end of both the first primary resistor Rp1 432a and the second primary resistor Rp2 432b are coupled to a ground terminal. In one example, a source terminal of a transistor in the circuit 400 is a first terminal, a drain terminal is a second terminal, and a gate terminal is a third terminal.

A drain terminal of the fifth transistor T5 442 is coupled to the second transistor T2 408 in the current mirror circuit 402, and a gate terminal of the fifth transistor T5 442 is coupled to the voltage divider network 450. A source terminal of the fifth transistor T5 442 is coupled to a drain terminal of the sixth transistor T6 444. A source terminal of the sixth transistor T6 444 is coupled to the drain terminal of the fourth transistor T4 424 and to the first end of the second primary resistor Rp2 432b. A gate terminal of the sixth transistor T6 444 is coupled to the source terminal of the fifth transistor T5 442 and to the drain terminal of the sixth transistor T6 444.

The output transistor T0 458 is coupled to the first stage 420, the current mirror circuit 402 and the voltage divider network 450. A gate terminal of the output transistor T0 458 is coupled to the drain terminal of the fourth transistor T4 424 in the first stage 420 and to the drain terminal of the transistor T1b 406 in the current mirror circuit 402. A source terminal of the output transistor T0 458 is coupled to the power supply Vdd 410. A drain terminal of the output transistor T0 458 is coupled to the voltage divider network 450.

The voltage divider network includes a first resistor R1 452 and a second resistor R2 454. A first end of the first resistor R1 452 is coupled to the drain terminal of the output transistor T0 458, and a second end of the first resistor R1 452 is coupled to the second resistor R2 454 and to the fifth transistor T5 442. A first end of the second resistor R2 454 is coupled to the first resistor R1 452 and to the fifth transistor T5 442. A second end of the second resistor R2 454 is coupled to a ground terminal.

The circuit 400 may include one or more conventional components that are not described herein for brevity. Each component of the circuit 400 may also be coupled to other components or blocks in FIG. 4, but those connections are not described herein for brevity. Also, each block or component of FIG. 4 may be coupled to conventional components of a system using the circuit 400, which are also not shown in FIG. 4 for brevity.

In operation, the configuration of the current mirror circuit 402 results in a current at the drain terminals of the first set of transistors (T1a 404 and T1b 406) being mirrored at the drain terminal of the second transistor T2 408. Accordingly, the current at the drain terminals of the first set of transistors (T1a 404 and T1b 406) is substantially the same as the current at the drain terminal of the second transistor T2 408. The first set of transistors (T1a 404 and T1b 406), the second transistor T2 408 and the output transistor T0 458, in one example, are PFETs. The third transistor T3 422, the fourth transistor T4 424, the fifth transistor T5 442 and the sixth transistor T6 444, in another example, are NFETs.

In one version, the third transistor T3 422 and the fourth transistor T4 424 are natural voltage threshold transistors (NVTs), having a negative voltage threshold. The negative voltage threshold, in one example, is within +/−10% of −400 mV. In yet another version, the fifth transistor T5 442 and the sixth transistor T6 444 are standard voltage threshold transistors with a positive voltage threshold. The positive voltage threshold, in one example, is within +/−10% of +600 millivolts (mV).

The third transistor T3 422, the fourth transistor T4 424, the fifth transistor T5 442 and the sixth transistor T6 444 form a voltage generation circuit. The first set of transistors (T1a 404 and T1b 406), the second transistor T2 408, the third transistor T3 422, the fourth transistor T4 424, the fifth transistor T5 442 and the sixth transistor T6 444 form a differential amplifier stage. The output transistor T0 458 and the voltage divider network 450 form a scaling amplifier stage. The first set of transistors (T1a 404 and T1b 406) and the second transistor T2 408 function as load transistors, while the third transistor T3 422, the fourth transistor T4 424, the fifth transistor T5 442 and the sixth transistor T6 444 function as input transistors, for the differential amplifier stage. At an output of this differential amplifier stage, a control signal is provided to the gate terminal of the output transistor T0 458. An output voltage Vout 460 is generated at the drain terminal of the output transistor T0 458. The output voltage Vout 460 is provided as a feedback to the differential amplifier stage at the gate terminal of the fifth transistor T5 442. In one example, the first primary resistor Rp1 432a and the second primary resistor Rp2 432b are equal.

The output voltage Vout 460 is a sum of a source-to-gate voltage (VsgNAT1) across the third transistor T3 422, a source-to-gate voltage (VsgNAT2) across the fourth transistor T4 424, a gate-to-source voltage (VgsSVT1) across the fifth transistor T5 442, a voltage gate-to-source (VgsSVT2) across the sixth transistor T6 444, and a voltage (Vscale) across the first resistor R1 452. The output voltage Vout 460 is expressed as:

$$V_{out}=V_{sgNAT1}+V_{sgNAT2}+V_{gsSVT1}+V_{gsSVT2}+V_{scale} \quad (15)$$

The source-to-gate voltage (VsgNAT1) across the third transistor T3 422 is equal to the source-to-gate voltage (VsgNAT2) across the second primary resistor Rp2 432b. Also, the gate-to-source voltage (VgsSVT1) across the fifth transistor T5 442 is equal to the gate-to-source voltage (VgsSVT2) across the sixth transistor T6 444. Thus, equation (15) can be expressed as:

$$V_{out}=2V_{sgNAT}+2V_{gsSVT}+V_{scale} \quad (16)$$

A difference between the gate-to-source voltage across the fourth transistor T4 424 and the gate-to-source voltage across the sixth transistor T6 444 is defined as a voltage threshold gap (VTgap), and can be expressed as sum of VsgNAT and VgsSVT. Accordingly, equation (16) can be expressed as:

$$V_{out}=2VT_{gap}+V_{scale} \quad (17)$$

Also, the voltage (Vscale) across the first resistor R1 452 is expressed as $$V_{scale} = 2VT_{gap} * \left(\frac{R1}{R2}\right) \quad (18)$$

Using equations (17) and (18), the output voltage Vout 460 can be expressed as:

$$V_{out} = 2VT_{gap} * \left(1 + \frac{R1}{R2}\right) \quad (19)$$

VTgap is a difference in threshold voltages of the fourth transistor T4 444 and the sixth transistor T6 444, and is generally in a range of 0.6V to 0.9V. Thus, the circuit 400 achieves higher level of output voltage Vout 460 without increasing noise in the output voltage Vout 460. The scaling of the first resistor R1 452 and the second resistor R2 454 is not required for higher output voltage Vout 460, which otherwise results in high thermal noise. For the same output voltage Vout, the first resistor R1 452 and the second resistor R2 454 in circuit 400 are smaller than the first resistor R1 152 and the second resistor R2 154 in circuit 100. Also, because scaling of VTgap is not required in the circuit 400, scaling of noise generated by combination of the first stage 420 and the second stage 440 is much lower as compared to the circuit 100.

The first stage 420 and the second stage 440 form the circuit 400 to generate higher output voltage Vout 460 without increasing the noise. This makes the circuit 400 useful as a voltage reference circuit. The circuit 400 is useful as a voltage reference circuit in applications where small sensed signals require very high resolution, because such circuits require precise output voltage Vout 460 with low noise. Also, the circuit 400 achieves lower noise without increase in quiescent current and accordingly is useful in portable or battery powered applications, because such circuits have more stringent quiescent current requirement along with requirements of low noise.

Figure 5:
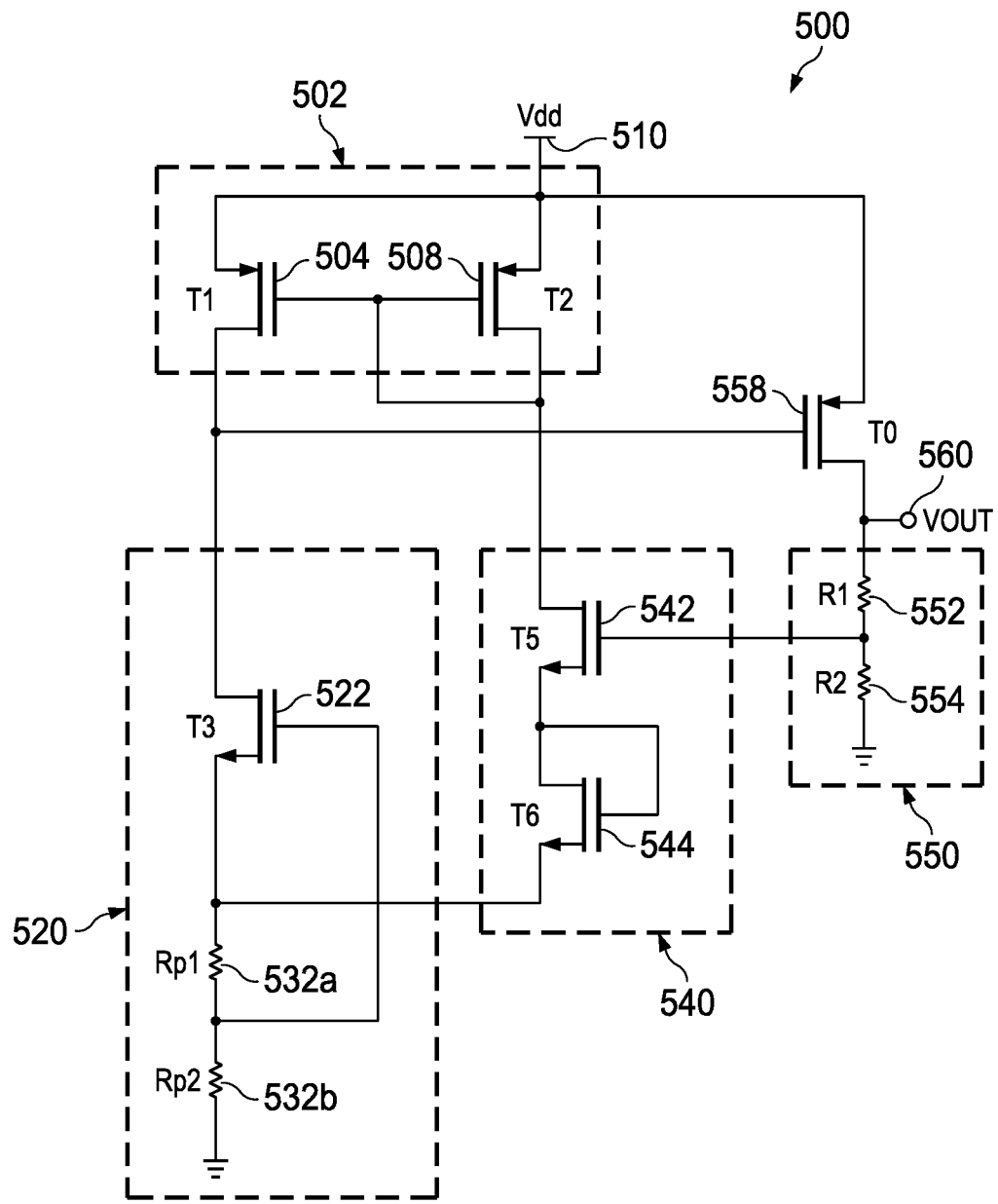
FIG. 5 is a schematic of a circuit, according to an embodiment.

FIG. 5 is a schematic of a circuit 500, according to an embodiment. The circuit 500 includes a current mirror circuit 502, a first stage 520, a second stage 540, a voltage divider network 550 and an output transistor T0 558. The current mirror circuit 502 is coupled to a power supply Vdd 510. The first stage 520 and the second stage 540 are coupled to the current mirror circuit 502. The first stage 520 is also coupled to the second stage 540. The first stage 520 includes a third transistor T3 522, a first primary resistor Rp1 532a and a second primary resistor Rp2 532b. The second stage 540 includes a fifth transistor T5 542 and a sixth transistor T6 544. The current mirror circuit 502 includes a first transistor T1 504 and a second transistor T2 508. A source terminal of the first transistor T1 504 is coupled to the power supply Vdd 510, and a drain terminal of the first transistor T1 504 is coupled to the third transistor T3 522. A gate terminal of the first transistor T1 504 is coupled to a gate terminal of the second transistor T2 508.

A source terminal of the second transistor T2 508 is coupled to the power supply Vdd 510, and a drain terminal of the second transistor T2 508 is coupled to the fifth transistor T5 542. A gate terminal of the second transistor T2 508 is coupled to the gate terminal of the first transistor T1 504 and to the drain terminal of the second transistor T2 508. For the third transistor T3 522, its drain terminal is coupled to the first transistor T1 504 in the current mirror circuit 502, and its gate terminal is coupled to a first end of the second primary resistor Rp2 532b. A source terminal of the third transistor T3 522 is coupled to the second stage 540 and to a first end of the first primary resistor Rp1 532a.

The first primary resistor Rp1 532a is coupled between the source and gate terminals of the third transistor T3 522. The first end of the first primary resistor Rp1 532a is also coupled to the second stage 540. The first end of the second primary resistor Rp2 532b is coupled to the gate terminal of the third transistor T3 522 and to the second end of the first primary resistor Rp1 532a. The second end of the second primary resistor Rp2 532b is coupled to a ground terminal. In one example, a source terminal of a transistor in the circuit 500 is a first terminal, a drain terminal is a second terminal, and a gate terminal is a third terminal.

A drain terminal of the fifth transistor T5 542 is coupled to the second transistor T2 508 in the current mirror circuit 502, and a gate terminal of the fifth transistor T5 542 is coupled to the voltage divider network 550. A source terminal of the fifth transistor T5 542 is coupled to a drain terminal of the sixth transistor T6 544. A source terminal of the sixth transistor T6 544 is coupled to the source terminal of the third transistor T3 522 and to the first end of the first primary resistor Rp1 532a. A gate terminal of the sixth transistor T6 544 is coupled to the source terminal of the fifth transistor T5 542 and to the drain terminal of the sixth transistor T6 544.

The output transistor T0 558 is coupled to the first stage 520, the current mirror circuit 502 and the voltage divider network 550. A gate terminal of the output transistor T0 558 is coupled to the drain terminal of the third transistor T3 522 in the first stage 520 and to the drain terminal of the first transistor T1 504 in the current mirror circuit 502. A source terminal of the output transistor T0 558 is coupled to the power supply Vdd 510. A drain terminal of the output transistor T0 558 is coupled to the voltage divider network 550.

The voltage divider network includes a first resistor R1 552 and a second resistor R2 554. A first end of the first resistor R1 552 is coupled to the drain terminal of the output transistor T0 558, and a second end of the first resistor R1 552 is coupled to the second resistor R2 554 and to the fifth transistor T5 542. A first end of the second resistor R2 554 is coupled to the first resistor R1 552 and to the fifth transistor T5 542. A second end of the second resistor R2 554 is coupled to a ground terminal.

The circuit 500 may include one or more conventional components that are not described herein for brevity. Each component of the circuit 500 may also be coupled to other components or blocks in FIG. 5, but those connections are not described herein for brevity. Also, each block or component of FIG. 5 may be coupled to conventional components of a system using circuit 500, which are also not shown in FIG. 5 for brevity.

In operation, the configuration of the current mirror circuit 502 results in a current at the drain terminal of the first transistor T1 504 being mirrored at the drain terminal of the second transistor T2 508. Accordingly, the current at the drain terminal of the first transistor T1 504 is substantially the same as the current at the drain terminal of the second transistor T2 508. The first transistor T1 504, the second transistor T2 508 and the output transistor T0 558, in one example, are PFETs. The third transistor T3 522, the fifth transistor T5 542 and the sixth transistor T6 544, in another example, are NFETs.

In one version, the third transistor T3 522 is a natural voltage threshold transistors (NVTs), having a negative voltage threshold. The negative voltage threshold, in one example, is within +/−10% of −500 mV. In yet another version, the fifth transistor T5 542 and the sixth transistor T6 544 are standard voltage threshold transistors with a positive voltage threshold. The positive voltage threshold, in one example, is within +/−10% of +600 millivolts (mV).

The third transistor T3 522, the fifth transistor T5 542 and the sixth transistor T6 544 form a voltage generation circuit. The first transistor T1 504, the second transistor T2 508, the third transistor T3 522, the fifth transistor T5 542 and the sixth transistor T6 544 form a differential amplifier stage. The output transistor T0 558 and the voltage divider network 550 form a scaling amplifier stage. The first transistor T1 504 and the second transistor T2 508 function as load transistors, while the third transistor T3 522, the fifth transistor T5 542 and the sixth transistor T6 544 function as input transistors, for the differential amplifier stage. At an output of this differential amplifier stage, a control signal is provided to the gate terminal of the output transistor T0 558. An output voltage Vout 560 is generated at the drain terminal of the output transistor T0 558. The output voltage Vout 560 is provided as a feedback to the differential amplifier stage at the gate terminal of the fifth transistor T5 542. In one example, the first primary resistor Rp1 532a and the second primary resistor Rp2 532b are equal.

The output voltage Vout 560 is a sum of a source-to-gate voltage (VsgNAT1) across the third transistor T3 522 (or a voltage across the first primary resistor Rp1 532a), a source-to-gate voltage (VsgNAT2) across the second primary resistor Rp2 532b, a gate-to-source voltage (VgsSVT1) across the fifth transistor T5 542, a gate-to-source voltage (VgsSVT2) across the sixth transistor T6 544, and a voltage (Vscale) across the first resistor R1 552. The output voltage Vout 560 is expressed as:

$$V_{out} = V_{sgNAT1} + V_{sgNAT2} + V_{gsSVT1} + V_{gsSVT2} + V_{scale} \tag{20}$$

The source-to-gate voltage (VsgNAT1) across the third transistor T3 522 is equal to the source-to-gate voltage (VsgNAT2) across the second primary resistor Rp2 532b, when the first primary resistor Rp1 532a and the second primary resistor Rp2 532b are equal. Also, the gate-to-source voltage (VgsSVT1) across the fifth transistor T5 542 is equal to the gate-to-source voltage (VgsSVT2) across the sixth transistor T6 544. Thus, equation (20) can be expressed as:

$$V_{out} = 2V_{sgNAT} + 2V_{gsSVT} + V_{scale} \tag{21}$$

A difference between the gate-to-source voltage across the third transistor T3 522 and the gate-to-source voltage across the sixth transistor T6 544 is defined as a voltage threshold gap (VTgap), and can be expressed as sum of VsgNAT and VgsSVT. Accordingly, equation (21) can be expressed as:

$$V_{out} = 2VT_{gap} + V_{scale} \tag{22}$$

Also, the voltage (Vscale) across the first resistor R1 552 is expressed as $$V_{scale} = 2VT_{gap} * \left(\frac{R1}{R2}\right) \tag{23}$$

Using equations (22) and (23), the output voltage Vout 560 can be expressed as:

$$V_{out} = 2VT_{gap} * \left(1 + \frac{R1}{R2}\right) \tag{24}$$

VTgap is a difference in threshold voltages of the third transistor T3 522 and the sixth transistor T6 544, and is generally in a range of 0.6V to 0.9V. Thus, circuit 500 achieves higher level of output voltage Vout 560 without increasing noise in the output voltage Vout 560. The scaling of the first resistor R1 552 and the second resistor R2 554 is not required for higher output voltage Vout 560, which otherwise results in high thermal noise. For the same output voltage Vout, the first resistor R1 552 and the second resistor R2 554 in circuit 500 are smaller than the first resistor R1 152 and the second resistor R2 154 in circuit 100. Also, because scaling of VTgap is not required in the circuit 500, scaling of noise generated by combination of the first stage 520 and the second stage 540 is much lower as compared to the circuit 100.

The stacking of the third transistor T3 522, the fifth transistor T5 542 and the sixth transistor T6 544 forms the circuit 500 to generate higher output voltage Vout 560 without increasing the noise. This makes the circuit 500 useful as a voltage reference circuit. The circuit 500 is useful as a voltage reference circuit in applications where small sensed signals require very high resolution, because such circuits require precise output voltage Vout 560 with low noise. Also, the circuit 500 achieves lower noise without increase in quiescent current and accordingly is useful in portable or battery powered applications, because such circuits have more stringent quiescent current requirement along with requirements of low noise.

Figure 6:
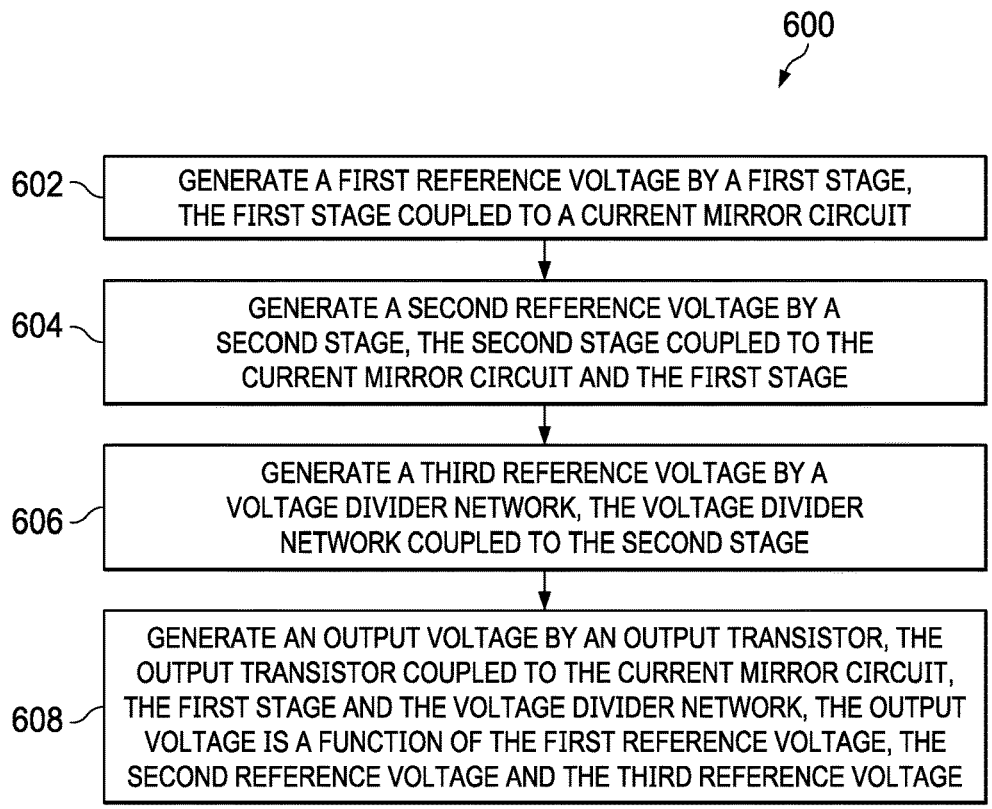
FIG. 6 is a flowchart of a method of operation of a circuit, according to an embodiment.

FIG. 6 is a flowchart 600 of a method of operation of a circuit, according to an embodiment. The flowchart 600 is described in connection with the circuit 200 of FIG. 2. The flowchart starts at step 602 and ends at step 608. At step 602, a first reference voltage is generated by a first stage. The first stage is coupled to a current mirror circuit. In circuit 200, for example, the first stage 220 is coupled to the current mirror circuit 202, and the first stage 220 includes the third transistor T3 222, the fourth transistor T4 224 and the primary resistor Rp 232. A voltage (VsgNAT1) is generated across the fourth transistor T4 224, and a voltage (VsgNAT2) is generated across the primary resistor Rp 232, both of which are equal. Accordingly, the first reference voltage (2VsgNAT) is generated by the first stage 220.

At step 604, a second reference voltage is generated by a second stage. The second stage is coupled to the current mirror circuit and the first stage. In circuit 200, the first stage 220 and the second stage 240 are coupled to the current mirror circuit 202. The first stage 220 is also coupled to the second stage 240. The second stage 240 includes a fifth transistor T5 242 and a sixth transistor T6 244. A voltage (VgsSVT1) is generated at the gate terminal of the fifth transistor T5 242, and a voltage (VgsSVT2) is generated at the gate terminal of the sixth transistor T6 244, both of which are equal. Accordingly, the second reference voltage (2VgsSVT) is generated by the second stage 240.

At step 606, a third reference voltage is generated by a voltage divider network. The voltage divider network is coupled to the second stage. The circuit 200 includes the voltage divider network 250. The voltage divider network 250 includes a first resistor R1 252 and a second resistor R2 254. The first resistor R1 252 and the second resistor R2 254 are coupled to the second stage 240. A voltage (Vscale) across the first resistor R1 252 is the third reference voltage.

An output voltage is generated by an output transistor, at step 608. The output transistor is coupled to the current mirror circuit, the first stage and the voltage divider network. The output voltage is a function of the first reference voltage, the second reference voltage and the third reference voltage. The circuit 200, for example, includes an output transistor T0 258. The output transistor T0 258 is coupled to the first stage 220, the current mirror circuit 202 and the voltage divider network 250. An output voltage Vout 260 is generated at the drain terminal of the output transistor T0 258. The output voltage Vout 260 is a function of the first reference voltage (2VsgNAT), the second reference voltage (2VgsSVT) and the third reference voltage (Vscale). In one example, the output voltage Vout 260 is expressed as:

$$V_{out} = 2V_{sgNAT} + 2V_{gsSVT} + V_{scale} \tag{25}$$

The first reference voltage (2VsgNAT) generated by the first stage 220 involves providing a power supply Vdd 210 to the current mirror circuit 202. The third transistor T3 222 is coupled to the current mirror circuit 202, and the fourth transistor T4 224 is coupled to the third transistor T3 222. The primary resistor Rp 232 is coupled between the gate terminals of the third transistor T3 222 and the fourth transistor T4 224.

The second reference voltage (2VgsSVT) generated by the second stage 240 involves providing the power supply Vdd 210 to the current mirror circuit 202. The fifth transistor T5 242 is coupled to the current mirror circuit 202 and the voltage divider network 250. The sixth transistor T6 244 is coupled to the fifth transistor T5 242 and to the first stage 220. The third reference voltage (Vscale) generated by the voltage divider network involves coupling the first resistor R1 252 to the output transistor T0 258 and to the second stage 240. The second resistor R2 254 is coupled to the first resistor R1 252 and to a ground terminal.

The output voltage Vout 260 generated by the output transistor T0 258 involves coupling a source terminal of the output transistor T0 258 to the power supply Vdd 210. A gate terminal of the output transistor T0 258 is coupled to the current mirror circuit 202 and to the first stage 220. A drain terminal of the output transistor T0 258 is coupled to the voltage divider network 250. The output voltage Vout 260 is generated at the drain terminal of the output transistor T0 258.

The method of flowchart 600 enables a circuit to generate higher output voltage Vout 260 without increasing the noise. This makes the circuit useful as a voltage reference circuit. A circuit, enabled by flowchart 600, is useful as a voltage reference circuit in applications where small sensed signals require very high resolution, because such circuits require precise output voltage Vout 260 with low noise. Also, the circuit is useful in portable or battery powered applications, because such circuits have more stringent quiescent current requirement along with requirements of low noise.

Figure 7:
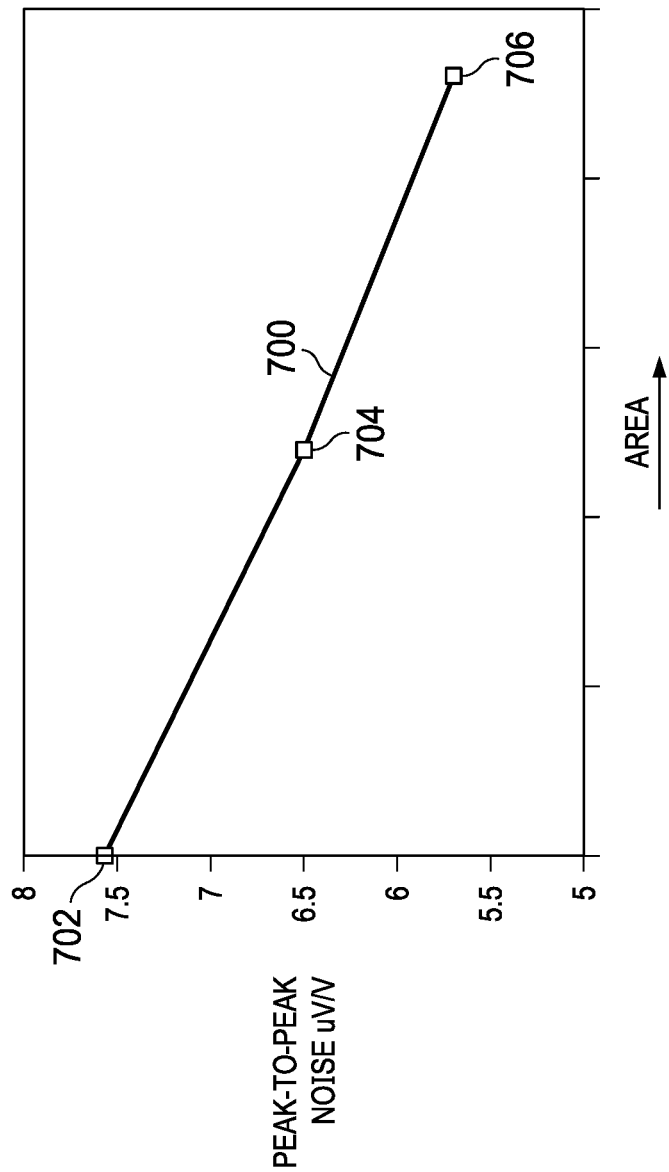
FIG. 7 is a graph of an example peak-to-peak noise relative to area for the example circuits of FIGS. 1, 2 and 5, according to an embodiment.

FIG. 7 is a graph 700 of an example peak-to-peak noise relative to area for the example circuits of FIGS. 1, 2 and 5, according to an embodiment. Point 702 represents the noise generated by the circuit 100 of FIG. 1. Point 706 represents noise generated by the circuit 200 of FIG. 2, and point 704 represents noise generated by the circuit 500 of FIG. 5. As shown in the graph 700, the noise generated by circuits 200 and 500 is less than the noise generated by the circuit 100. The additional transistors or primary resistors in the first stage of circuit 200 and 500 achieve reduced noise.

Also, the output voltage Vout generated by circuit 200 and 500 is higher than the output voltage generated by the circuit 100. To achieve same level of output voltage Vout in the circuit 100, scaling of the first resistor and the second resistor in the voltage divider network is required, which increases the reference noise. Thus, the sizes of resistors in voltage divider network in circuit 200 and 500 are smaller than those in the circuit 100.

The low noise feature of circuits 200 and 500 makes these circuits useful as voltage reference circuit. The circuits 200 and 500 are useful as a voltage reference circuit in applications where small sensed signals require very high resolution, because such circuits require precise output voltage with low noise. Also, these circuits are useful in portable or battery powered applications, because such circuits have more stringent quiescent current requirement along with requirements of low noise.

Figure 8:
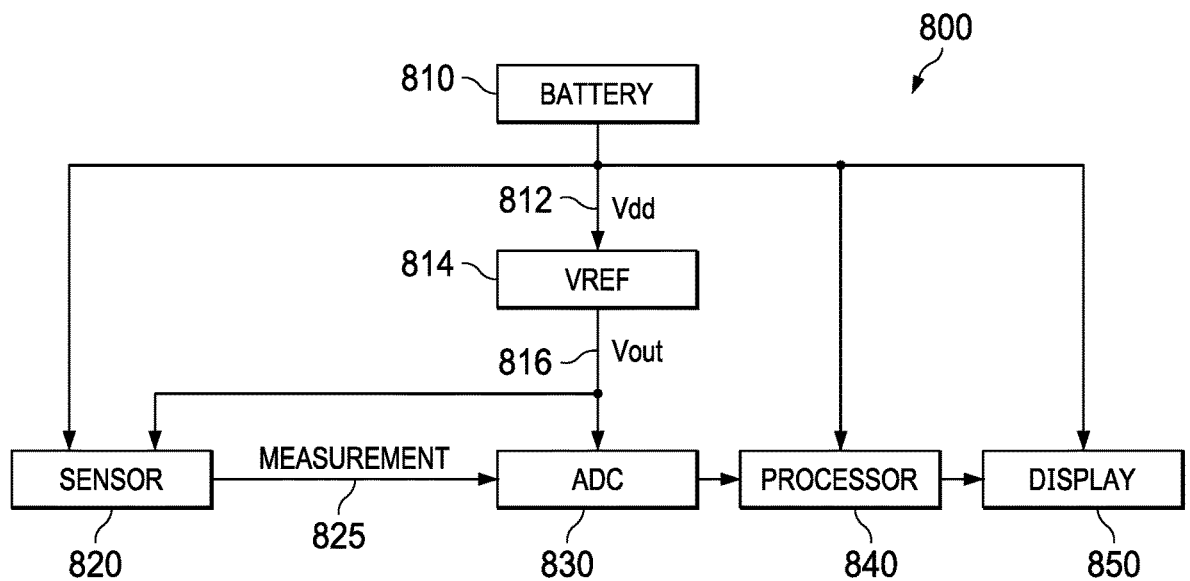
FIG. 8 is a block diagram of an example device in which several aspects of example embodiments can be implemented.

FIG. 8 is a block diagram of an example device 800 in which several aspects of example embodiments can be implemented. The device 800 is, or is incorporated into or is part of, a server farm, a vehicle, a communication device, a transceiver, a personal computer, a gaming platform, a computing device, any other type of electronic system, or a portable device such as a battery powered handheld measurement device. The device 800 may include one or more conventional components that are not described herein for brevity.

The device 800 includes a battery 810, a voltage reference circuit Vref 814, a sensor 820, an analog to digital converter (ADC) 830 and a display 850, The processor 840 can be a CISC-type CPU (complex instruction set computer), a RISC-type CPU (reduced instruction set computer), a digital signal processor (DSP) a microprocessor, a CPLD (complex programmable logic device), or an FPGA (field programmable gate array). The battery 810 is configured to provide power supply Vdd 812 to the Vref circuit 814, a sensor 820, a processor 840 and a display 850.

The voltage reference circuit Vref 814 is similar, in connection and operation, to one of the circuits 200, 300, 400 or 500 of FIGS. 2 to 5 respectively. Similar to circuit 200, the voltage reference circuit Vref 814 includes a current mirror circuit, a first stage, a second stage, a voltage divider network and an output transistor. A voltage (2VsgNAT) generated by the first stage is a first reference voltage, and the voltage (2VgsSVT) generated by the second stage is a second reference voltage. A voltage (Vscale) generated by the voltage divider network is a third reference voltage. An output voltage Vout 816 (generated by the voltage reference circuit Vref 814) is a function of the first reference voltage (2VsgNAT), the second reference voltage (2VgsSVT) and the third reference voltage (Vscale).

The voltage reference circuit Vref 814 provides an accurate and stable output voltage Vout 816 for use by the sensor 820 and an ADC 830, which may be required for small signal measurements. If the device 800 is handheld and battery powered, then the relatively low Iq provided by the voltage reference circuit Vref 814 is also beneficial. The sensor 820 generates an analog measurement signal 825, which is converted into a digital signal by ADC 830 to be supplied to the processor 840. The processor 840 may then manipulate the signal by performing any suitable signal processing functions, such as averaging, filtering, etc., and then provide results to be displayed on the display 850.

The voltage reference circuit Vref 814 is able to provide higher output voltage Vout 816 (as compared to Vout generated by circuit 100) without increasing the noise of the device 800. Even when the sensor 820 generates small sense signals that require higher resolution, the voltage reference circuit Vref 814 generates precise output voltage Vout 816 with low noise. When the sensor 820 is an environmental sensor or a medical application sensor, the voltage reference circuit Vref 814 provides a precise output voltage Vout 816, thereby increasing the accuracy of the device 800 as the voltage reference circuit Vref 814 provides low temperature drift.

Figure 9:
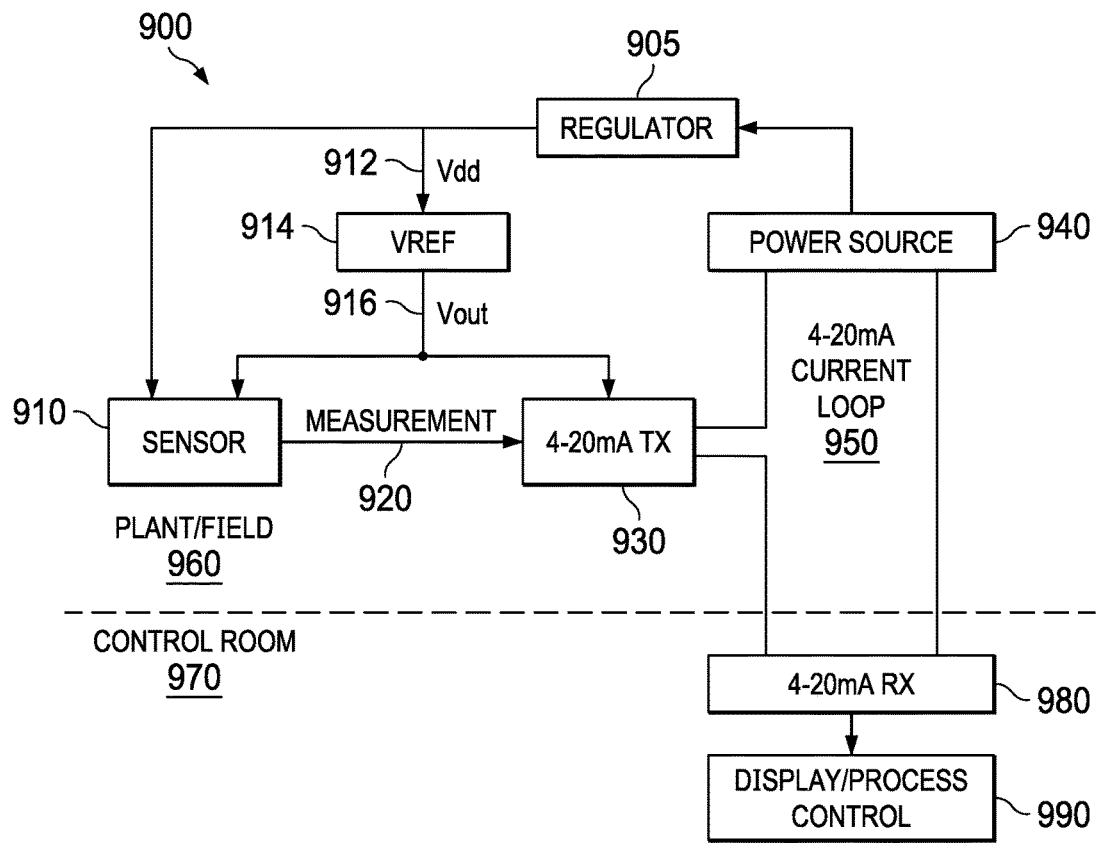
FIG. 9 illustrates another example application of the circuit of FIG. 2, 3, 4 or 5, in accordance with an embodiment.

FIG. 9 illustrates another example application 900 of the circuit of FIG. 2, 3, 4 or 5, in accordance with an embodiment. This example shows an industrial plant process monitoring application in which a processing condition is monitored by a sensor 910, located in the plant or field 960, and the sensor measurements 920 are transmitted back to a control room 970. The measurements are transmitted using a 4-20 mA current loop 950 in which the message is encoded in a current signal that ranges from 4 milliamps (mA) to 20 mA. A power source 940 is configured to provide power to a voltage regulator 905, which is configured to provide a power supply Vdd 912 to a voltage reference circuit Vref 914 and to the sensor 910.

The voltage reference circuit Vref 914 is similar, in connection and operation, to one of the circuits 200, 300, 400 or 500 of FIGS. 2 to 5 respectively. Similar to circuit 200, the voltage reference circuit Vref 914 includes a current mirror circuit, a first stage, a second stage, a voltage divider network and an output transistor. A voltage (2VsgNAT)

generated by the first stage is a first reference voltage, and the voltage (2VgsSVT) generated by the second stage is a second reference voltage. A voltage (Vscale) generated by the voltage divider network is a third reference voltage. An output voltage Vout 916 (generated by the voltage reference circuit Vref 914) is a function of the first reference voltage (2VsgNAT), the second reference voltage (2VgsSVT) and the third reference voltage (Vscale).

The voltage reference circuit Vref 914 provides an accurate and stable output voltage Vout 916 for use by the sensor 910 and the 4-20 mA signal transmitter 930. The power source 940 is configured to provide a coarse voltage that drives the 4-20 mA current loop 950, while the 4-20 mA signal transmitter 930 is configured to modulate the current flow through the 4-20 mA current loop 950 with relatively high accuracy.

On the control room side 970, a 4-20 mA receiver 980 is configured to decode the message from the received current in the 4-20 mA current loop 950. The decoded message, which represents the sensor measurement 920, is then provided to a display or process controller 990 for further control of the industrial process.

The voltage reference circuit Vref 914 is able to provide higher output voltage Vout 916 (as compared to Vout generated by circuit 100) without increasing the noise of the system 900. Even when the sensor 910 generates small sense signals that require higher resolution, the voltage reference circuit Vref 914 generates precise output voltage Vout 916 with low noise. When the sensor 910 is an environmental sensor or a medical application sensor, the voltage reference circuit Vref 914 provides a precise output voltage Vout 916, thereby increasing the accuracy of the system 900 as the voltage reference circuit Vref 914 provides low temperature drift.

In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A circuit comprising:
    a current mirror circuit including:
        a first transistor having first, second and third terminals; and
        a second transistor having a first terminal, a second terminal, and a third terminal, in which the third terminal of the second transistor is coupled to the third terminal of the first transistor and to the second terminal of the second transistor;
    a first stage coupled to the second terminal of the first transistor, wherein the first stage includes:
        a third transistor having first, second and third terminals, in which the second terminal of the third transistor is coupled to the current mirror circuit;
        a fourth transistor having first, second and third terminals, in which the second terminal of the fourth transistor is coupled to the first terminal of the third transistor, and the first terminal of the fourth transistor is coupled to the third terminal of the third transistor; and
        a resistor having first and second ends, in which the first end is coupled to the third terminal of the third transistor and to the first terminal of the fourth transistor, and the second end is coupled to the third terminal of the fourth transistor;
    a second stage coupled to the second terminal of the second transistor and to the first stage;
    a voltage divider network coupled to the second stage; and
    an output transistor having first, second, and third terminals, in which the second terminal of the output transistor is coupled to the voltage divider network and the third terminal of the output transistor is coupled to the first stage.

2. The circuit of claim 1, wherein the second stage includes:
    a fifth transistor having first, second and third terminals, in which the second terminal of the fifth transistor is coupled to the current mirror circuit, and the third terminal of the fifth transistor is coupled to the voltage divider network; and
    a sixth transistor having first, second and third terminals, in which: the second terminal of the sixth transistor is coupled to the first terminal of the fifth transistor; the first terminal of the sixth transistor is coupled to the first terminal of the third transistor and to the second terminal of the fourth transistor; and the third terminal of the sixth transistor is coupled to the first terminal of the fifth transistor and to the second terminal of the sixth transistor.

3. The circuit of claim 2, wherein the third terminal of the output transistor is coupled to a power input terminal, and the first terminal of the output transistor is coupled to the first and third transistors.

4. The circuit of claim 2; wherein the voltage divider network includes:
    a first resistor coupled between the second terminal of the output transistor and the third terminal of the fifth transistor; and
    a second resistor coupled between the first resistor and a ground terminal.

5. The circuit of claim 4, wherein the output transistor is configured to generate an output voltage at the second terminal of the output transistor, and the output voltage is a function of: a voltage across the fourth transistor; a voltage across the third transistor; a voltage across the fifth and sixth transistors; and a voltage across the first resistor.

6. A method comprising:
    generating a first reference voltage by a first stage that is coupled to a first transistor of a current mirror circuit, wherein generating the first reference voltage by the first stage includes:
        providing a power supply to the current mirror circuit;
        coupling a third transistor to the current mirror circuit;
        coupling a fourth transistor to the third transistor; and
        coupling a first end of a resistor to a gate of the third transistor, and coupling a second end of the resistor to a gate of the fourth transistor;
    generating a second reference voltage by a second stage that is coupled to a second transistor of the current mirror circuit and the first stage;
    generating a third reference voltage by a voltage divider network that is coupled to the second stage; and
    generating an output voltage by an output transistor that is coupled to the current mirror circuit, the first stage and the voltage divider network, in which the output voltage is a function of the first, second and third reference voltages.

7. The method of claim 6, wherein generating the second reference voltage by the second stage includes:
    providing the power supply to the current mirror circuit;

coupling a fifth transistor to the current mirror circuit and to the voltage divider network; and
coupling a sixth transistor to the fifth transistor and to the first stage.

8. The method of claim 7, wherein generating the third reference voltage includes:
coupling a first resistor in the voltage divider network to the output transistor and to the second stage; and
coupling a second resistor in the voltage divider network to the first resistor in the voltage divider network and to a ground terminal.

9. The method of claim 8, wherein generating the output voltage by the output transistor includes:
coupling a source of the output transistor to the power supply;
coupling a gate of the output transistor to the current mirror circuit and to the first stage; and
coupling a drain of the output transistor to the voltage divider network, in which the output voltage is generated at the drain of the output transistor.

10. The method of claim 6, wherein generating the first reference voltage by the first stage includes:
coupling a second resistor to the first resistor.

11. A device comprising:
a voltage reference circuit configured to provide an output voltage based on power at a battery input terminal;
a sensor coupled to the voltage reference circuit, the sensor configured to be driven by the output voltage and to provide an analog measurement signal; and
an analog to digital converter (ADC) coupled to the voltage reference circuit and to the sensor, the ADC configured to be driven by the output voltage and to convert the analog measurement signal into a digital signal;
in which the voltage reference circuit includes:
a current mirror circuit;
a first stage coupled to the current mirror circuit, wherein the first stage includes a first set of transistors;
a second stage coupled to the current mirror circuit and to the first stage, wherein the second stage includes a second set of transistors;
a voltage divider network coupled to the second stage; and
an output transistor having first and second terminals, in which the first terminal is coupled to the first stage, and the second terminal is coupled to the voltage divider network.

12. The device of claim 11, wherein a sum of threshold voltages of the second set of transistors is greater than a sum of threshold voltages of the first set of transistors.

13. The device of claim 12, wherein the first set of transistors includes a third transistor and a fourth transistor, and the second set of transistors includes a fifth transistor and a sixth transistor.

14. The device of claim 12, wherein the current mirror circuit includes:
a first transistor having first, second and third terminals, in which the first terminal of the first transistor is coupled to the battery input terminal, and the second terminal of the first transistor is coupled to the first stage; and
a second transistor having first, second and third terminals, in which the first terminal of the second transistor is coupled to the battery input terminal, and the second terminal of the second transistor is coupled to the second stage, and the third terminal of the second transistor is coupled to the third terminal of the first transistor and to the second terminal of the second transistor.

15. A circuit comprising:
a current mirror circuit including:
a first transistor having first, second and third terminals;
a second transistor having first, second and third terminals, in which the third terminal of the second transistor is coupled to the third terminal of the first transistor; and
a third transistor having first, second and third terminals, in which the third terminal of the second transistor is coupled to the third terminal of the third transistor and to the second terminal of the third transistor;
a first stage coupled to the current mirror circuit, wherein the first stage includes:
a fourth transistor having first, second and third terminals, in which the second terminal of the fourth transistor is coupled to the current mirror circuit;
a fifth transistor having first, second and third terminals, in which the second terminal of the fifth transistor is coupled to the current mirror circuit, and the third terminal of the fifth transistor is coupled to the first terminal of the fourth transistor;
a first resistor having first and second terminals, in which the first terminal is coupled to the third terminal of the fourth transistor, and the second terminal is coupled to the first terminal of the fourth transistor; and
a second resistor having first and second terminals, in which the second terminal is coupled to the first terminal of the fifth transistor;
a second stage coupled to the current mirror circuit and to the first stage;
a voltage divider network coupled to the second stage; and
an output transistor having first, second and third terminals, in which the third terminal of the output transistor is coupled to the current mirror circuit and the first stage.

16. The circuit of claim 15, wherein:
the second stage includes a sixth transistor having first, second and third terminals, in which the second terminal of the sixth transistor is coupled to the second terminal of the third transistor.

17. The circuit of claim 16, wherein:
the second stage includes a seventh transistor having first, second and third terminals, in which the second terminal of the seventh transistor is coupled to the first terminal of the sixth transistor and the third terminal of the seventh transistor; and
the first terminal of the seventh transistor is coupled to the first terminal of the fifth transistor.

18. A circuit comprising:
a current mirror circuit including:
a first transistor having first, second and third terminals;
a second transistor having first, second and third terminals, in which the third terminal of the second transistor is coupled to the second terminal of the second transistor and the third terminal of the first transistor; and
a first stage coupled to the current mirror circuit, wherein the first stage includes:
a third transistor having first, second and third terminals, in which the second terminal of the third transistor is coupled to the current mirror circuit; and a first voltage divider network coupled to the first terminal of the third transistor; and a second stage coupled to the current mirror circuit and to the first stage;

a second voltage divider network coupled to the second stage; and an output transistor having first, second and third terminals, in which the second terminal of the output transistor is coupled to the second voltage divider network, the third terminal of the output transistor is coupled to the current mirror circuit and the first stage.

19. The circuit of claim 18, wherein:

the first voltage divider network includes:

a first resistor with a first terminal and a second terminal; and a second resistor with a first terminal and a second terminal;

the first terminal of the first resistor is coupled to the first terminal of the third transistor;

the first terminal of the second resistor is coupled to the second terminal of the first resistor; and the third terminal of the third transistor is coupled to the first terminal of the second resistor and the second terminal of the first resistor.

20. The circuit of claim 18, wherein:

the second stage includes a fourth transistor having first, second and third terminals, in which the second terminal of the fourth transistor is coupled to the second terminal of the third transistor.

21. The circuit of claim 20, wherein:

the second stage includes a fifth transistor having first, second and third terminals, in which the second terminal of the fifth transistor is coupled to the first terminal of the fourth transistor and the third terminal of the fifth transistor; and the first terminal of the fifth transistor is coupled to the first terminal of the third transistor.

\* \* \* \* \*